(12) United States Patent
Takagi

(10) Patent No.: US 7,875,911 B2
(45) Date of Patent: Jan. 25, 2011

(54) SEMICONDUCTOR DEVICE AND OSCILLATOR

(75) Inventor: Shigekazu Takagi, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 388 days.

(21) Appl. No.: 11/456,973

(22) Filed: Jul. 12, 2006

(65) Prior Publication Data

US 2007/0023862 A1    Feb. 1, 2007

(30) Foreign Application Priority Data

Jul. 27, 2005    (JP)    ............... 2005-216883
Jun. 27, 2006    (JP)    ............... 2006-176274

(51) Int. Cl.
*H01L 23/52*    (2006.01)

(52) U.S. Cl. ............... 257/276; 257/277; 257/E23.013; 257/E23.103

(58) Field of Classification Search ................. 257/531, 257/532, 621, 276, 277, E23.013, E23.103
See application file for complete search history.

(56) References Cited

U.S. PATENT DOCUMENTS

| 6,218,729 | B1 * | 4/2001 | Zavrel et al. ................. 257/698 |
| 6,504,227 | B1 * | 1/2003 | Matsuo et al. ............... 257/531 |
| 6,869,870 | B2 * | 3/2005 | Lin ............................. 438/622 |
| 6,900,976 | B2 | 5/2005 | Hiraoka et al. |
| 7,005,721 | B2 * | 2/2006 | Nishijima ..................... 257/531 |
| 7,235,477 | B2 * | 6/2007 | Ogawa ........................ 438/622 |
| 7,271,465 | B2 * | 9/2007 | Jessie et al. ................. 257/531 |

FOREIGN PATENT DOCUMENTS

| JP | A-8-172161 | 7/1996 |
| JP | A-2004-172411 | 6/2004 |
| JP | A 2005-006153 | 1/2005 |
| JP | A-2005-123378 | 5/2005 |
| JP | A 2005-126883 | 8/2005 |

\* cited by examiner

*Primary Examiner*—Zandra Smith
*Assistant Examiner*—Tsz K Chiu
(74) *Attorney, Agent, or Firm*—Oliff & Berridge, PLC

(57) ABSTRACT

A semiconductor device includes a semiconductor substrate including an active element or an integrated circuit and a plurality of connection electrodes to be electrically connected to the integrated circuit; a first resin layer formed on a surface of the semiconductor substrate on which the connection electrodes are formed in such a manner avoiding the connection electrodes; a connection wiring layer formed between the semiconductor substrate and the first resin layer and connected to one of the plurality of connection electrodes; a Cu wiring layer connected at one end thereof to the connection wiring layer and formed on the surface of the first resin layer; a passive element composed of the connection wiring layer and the Cu wiring layer; a second resin layer for covering a surface of the Cu wiring layer; and an external terminal electrically connected to some of the plurality of connection electrodes and formed such that a portion of the second resin layer protrudes from the second resin layer.

9 Claims, 4 Drawing Sheets

SEMICONDUCTOR DEVICE AND OSCILLATOR

BACKGROUND

1. Technical Field

The invention relates to a semiconductor device and an oscillator. More specifically, the invention relates the semiconductor device in which a resin layer is formed on a semiconductor substrate including an integrated circuit and further in which passive elements composed of Cu wiring layers are formed on a surface of the resin layer, and the oscillator formed in the semiconductor device by the passive elements.

2. Related Art

According to the related art example, a voltage controlled oscillator formed in the semiconductor device having the semiconductor substrate and a multi-layered wiring layer mounted thereon in which output terminals, spiral inductors which are provided on the multi-layered wiring layer and connected to the output terminals, variable capacitors which are formed on an area where an area immediately below the spiral inductors is included but a central axis of the spiral inductors is not included and which are connected to the spiral inductors in parallel to form a resonance circuit together with the spiral inductors has been known. JP-A-2005-6153 at page 5 and in FIGS. 1 and 2 is the example of the above described related art.

As described in the example, the spiral inductors formed on the surface of the multi-layered wiring layer on the semiconductor substrate and variable capacitors provided in the integrated circuit which is composed of the semiconductor substrate and the multi-layered wiring layer constitute the resonant circuit. Because such spiral inductors are generally formed of Al wiring, there involves a problem that a phase noise characteristic can not be improved since, for example, a specific resistance of Al wiring is larger than that of the Cu wiring by approximately 30% and Q values of the inductors are low.

The above stated variable capacitors are formed in the integrated circuit of the semiconductor substrate, such that there are restrictions in capacity of capacitance and sizes of opposite electrodes due to the existing limitations in applicable dielectric material for forming the capacitors and sizes of opposite electrodes. Therefore, it is not possible to realize to manufacture the oscillator having a low frequency area, or to broaden a selectable width of the frequency.

SUMMARY

An advantage of some aspects of the invention is to provide the oscillator having passive elements of high Q values, being excellent in phase noise characteristic and being capable of broadening a selectable width of frequency, as well as to provide a semiconductor device having such oscillator and being capable of constituting a package of a semiconductor chip size.

The semiconductor device according to an aspect of the invention includes a semiconductor substrate including an active element or an integrated circuit and a plurality of connection electrodes to be electrically connected to the integrated circuit; a first resin layer formed on a surface of the semiconductor substrate where the connection electrodes are formed on, avoiding the connection electrodes; a connection wiring layer formed between the semiconductor substrate and the first resin layer and connected to one of the plurality of connection electrodes; a Cu wiring layer connected at one end thereof to the connection wiring layer and formed on a surface of the first resin layer; passive elements composed of the connection wiring layer and the Cu wiring layer; a second resin layer which covers a surface of the Cu wiring layer; and external terminals electrically connected to some of the plurality of connection electrodes and so formed that a portion of the second resin layer projects from the second resin layer.

According to the aspect of the invention, the passive elements are constituted of the connection wiring layer formed between the semiconductor substrate and the first resin layer and connected to one of the plurality of connection electrodes and the Cu wiring layer formed on the surface of the first resin layer. Since Cu wiring has a smaller specific resistance than that of the Al wiring having been used by approximately 30%, the Q value can be raised when constituting the passive elements using the Cu wiring. In view of the foregoing, the phase noise characteristic can be improved if the Cu wiring is employed for the resonance circuit of the oscillator or the like.

In a case where the semiconductor substrate is the semiconductor chip which is separated from a wafer by scribing, the passive elements are formed on the surface of the first resin layer on the semiconductor substrate by using the Cu wiring layer. As such, the passive elements can be formed almost over the entire plane shaped portion, namely, a plane area, of the semiconductor chip, thereby being capable of enlarging the plane area, broadening the Cu wiring width, and minimizing a wiring resistance.

The passive elements including the active elements are protectable since the uppermost Cu wiring layer, except for portions of the external terminals, is covered with the second resin layer.

The invention is featured in that the passive elements are spiral inductors composed of the Cu wring layer formed on the surface of the first resin layer.

As stated above, the spiral inductors composed of the Cu wiring layer are obtainable of the smaller specific resistance than the spiral inductors composed of the Al wiring of the related art. Further, the Cu wiring can be formed through a Cu electrochemical plating, such that the thicknesses of the spiral inductors can be made large and thus the wiring resistance can be minimized. As it is known, the Q value is in proportion to a reactance and is inversely proportion to the resistance value. That is, the Q value can be raised by lowering the resistance value of the spiral inductors.

As patterns of the spiral inductors are formed of the Cu wiring on the surface of the first resin layer on the semiconductor substrate, a space is obtainable from the semiconductor substrate. Therefore, a loss caused by a parasitic capacitance component generated between the patterns of the spiral inductors and the semiconductor substrate can be minimized, thereby capable of raising the Q value.

Here, a case where the above stated spiral inductors are used for the oscillator is considered. It is known that the phase noise characteristic is inverse proportion to the square of the Q value, such that the phase noise can be remarkably reduced by raising the Q value. The Q value used in consideration of the phase noise characteristic is a value indicative of a load Q which represents a loss of the entire oscillating circuit. According to the LC resonance circuit using the spiral inductors of the aspect of the invention, the Q value of the spiral inductor section dominates. Consequently, when the Q value of the spiral inductor section is raised, the phase noise can be reduced remarkably.

The invention is featured in that the passive elements correspond to capacitors composed of the connection wiring layer, the Cu wiring layer and the first resin layer sandwiched between areas where the connection wring layer and the Cu wiring layer intersect each other, in which the capacitors are connected in parallel with the variable capacitors provided on the integrated circuit.

Here, the first resin layer constituting the capacitors serves as an dielectric material for the multi-layered type capacitor, and the Cu wiring layer and the connection wiring layer correspond to the electrodes for sandwiching the dielectric material.

Providing the capacitors outside the integrated circuit makes it possible to enlarge the electric capacity. It is known that the oscillating frequency becomes smaller when the electric capacity becomes larger. In view of the foregoing, it become possible to realize to manufacture the oscillator having the low frequency area.

The variable capacitor formed in the integrated circuit has restrictions in size and dielectric constant, and therefore, has the limitation in electric capacity. However, if the capacitors according to the aspect of the invention is employed, the selectable width of the frequency can be broaden as well as the area where the Cu wiring layer is formed on the surface of the semiconductor substrate can be enlarged, resulting in being capable of enlarging the electric capacity.

A construction in which the capacitors composed of the Cu wiring layer are provided in parallel in addition to the variable capacitors will contribute to broaden a setting rage of the electric capacity of the capacitors, resulting in producing such an advantageous effect that the width of the frequency band can be broadened when employing such capacitors for the resonator.

The invention is featured in that the passive elements are composed of the capacitors including the spiral inductors composed of the first Cu wiring layer formed on the surface of the first resin layer, the second Cu wiring layer formed on the surface of the first resin layer, the connection wring layer, and the first resin layer sandwiched by the areas where the second Cu wiring layer and the connection wring layer intersect each other.

According to the aspect of the invention, both advantageous effects such as an effect produced by forming the above stated spiral inductors and an effect produced by forming the above stated capacitors are obtainable by forming the spiral inductors and the capacitors with the Cu wiring layer.

Further, according to the aspect of the invention, since the first Cu wiring layer forming the spiral inductors and the second Cu wiring layer composing the capacitors are formed on almost the same plane of the first resin layer, these Cu wiring layers can be formed in the same process while having two passive elements, thereby being capable of enhancing the manufacturing efficiency.

According to the aspect of the invention, it is preferable that the semiconductor device is sealed with the second resin layer, except for portions of the external terminals.

With the above stated structure, the semiconductor device, including the Cu wiring layer composing the passive elements, is sealed with the second resin layer, such that no further packaging is necessary because the second layer actually provides the effect equivalent to the packaging. Thus, a small sized thin semiconductor device, which is packaged to have a size of the semiconductor chip, can be provided.

The oscillator according to the aspect of the invention is featured in having a semiconductor substrate including the active element or the integrated circuit and the plurality of connection electrodes electrically connected to the integrated circuit; the first resin layer formed on the surface of the semiconductor substrate on which the connection electrodes are formed while avoiding the connection electrodes; the above stated spiral inductors composing the resonance circuit on the surface of the first resin layer; the passive elements connected in parallel with one of or both of the capacitors; and the external terminals to be connected to some of the plurality of connection electrodes.

According to the aspect of the invention, because the passive elements or the spiral inductors and the capacitors which are composed of the above stated Cu wiring are provided outside the integrated circuit, the oscillator which has the passive elements having the high Q values, which is excellent in the phase noise characteristic, and which is capable of broadening the selectable width of the frequency can be realized.

DESCRIPTION OF EXEMPLARY EMBODIMENTS

Embodiments of the invention will be explained hereinafter, referring to the attached drawings.

Figure 1:
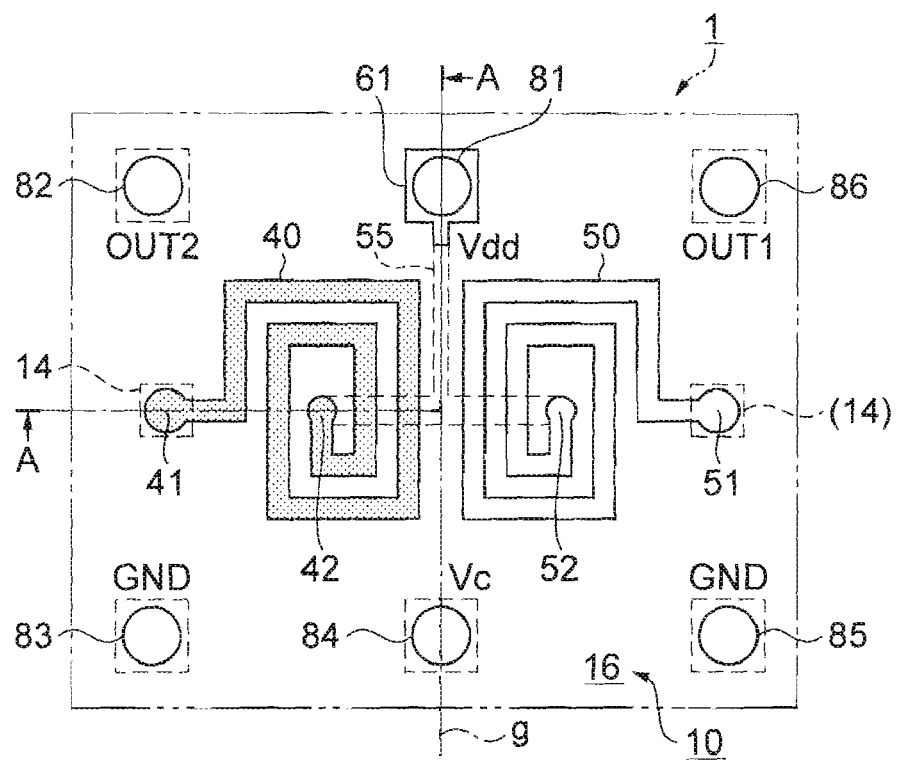
FIG. 1 is a plane view of a semiconductor device according to a first embodiment of the invention.
Figure 2:
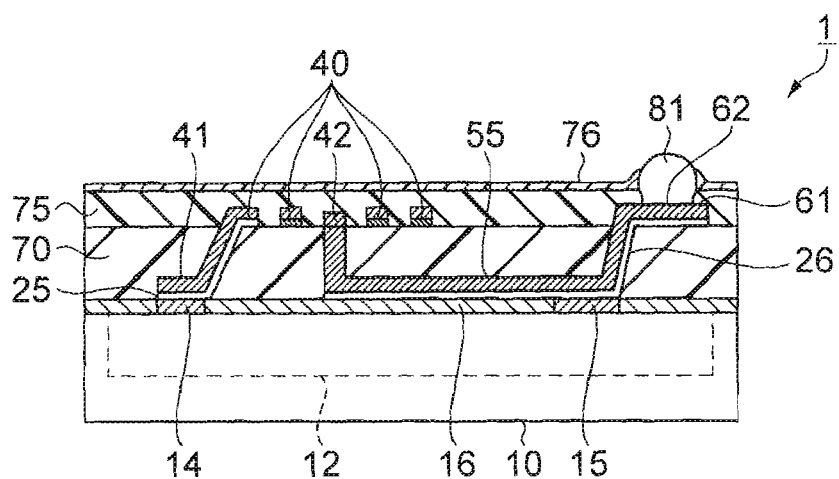
FIG. 2 is a cross sectional view of the semiconductor device according to the first embodiment of the invention.
Figure 3:
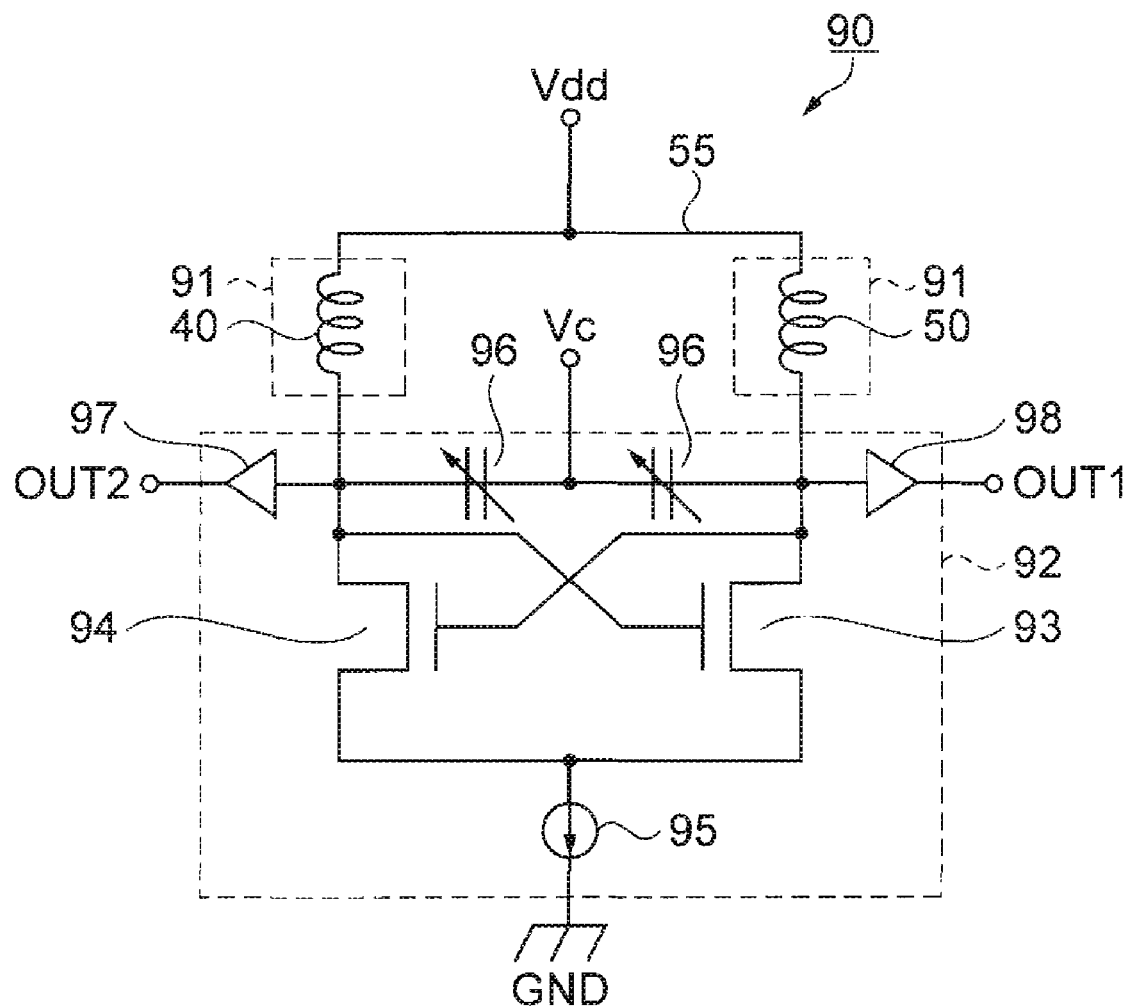
FIG. 3 is a circuit diagram illustrating a basic circuitry of a voltage controlled oscillator of the semiconductor device according to the first embodiment of the invention.
Figure 4:
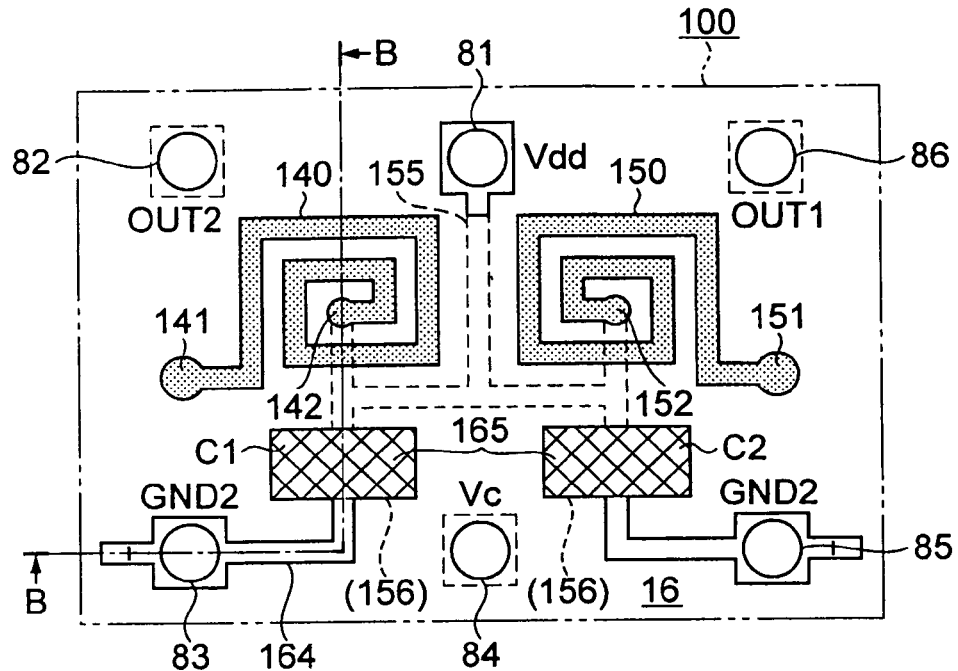
FIG. 4 is a plane view of the semiconductor device according to a second embodiment of the invention.
Figure 5:
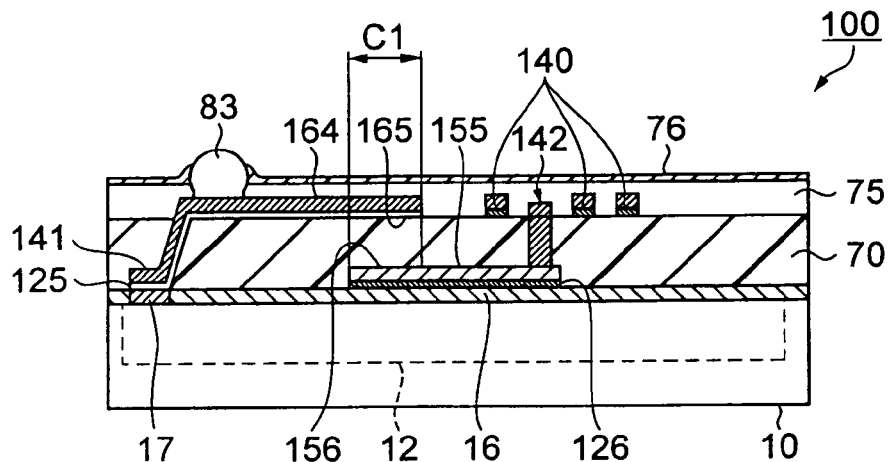
FIG. 5 is a cross sectional view of the semiconductor device according to the second embodiment of the invention.
Figure 6:
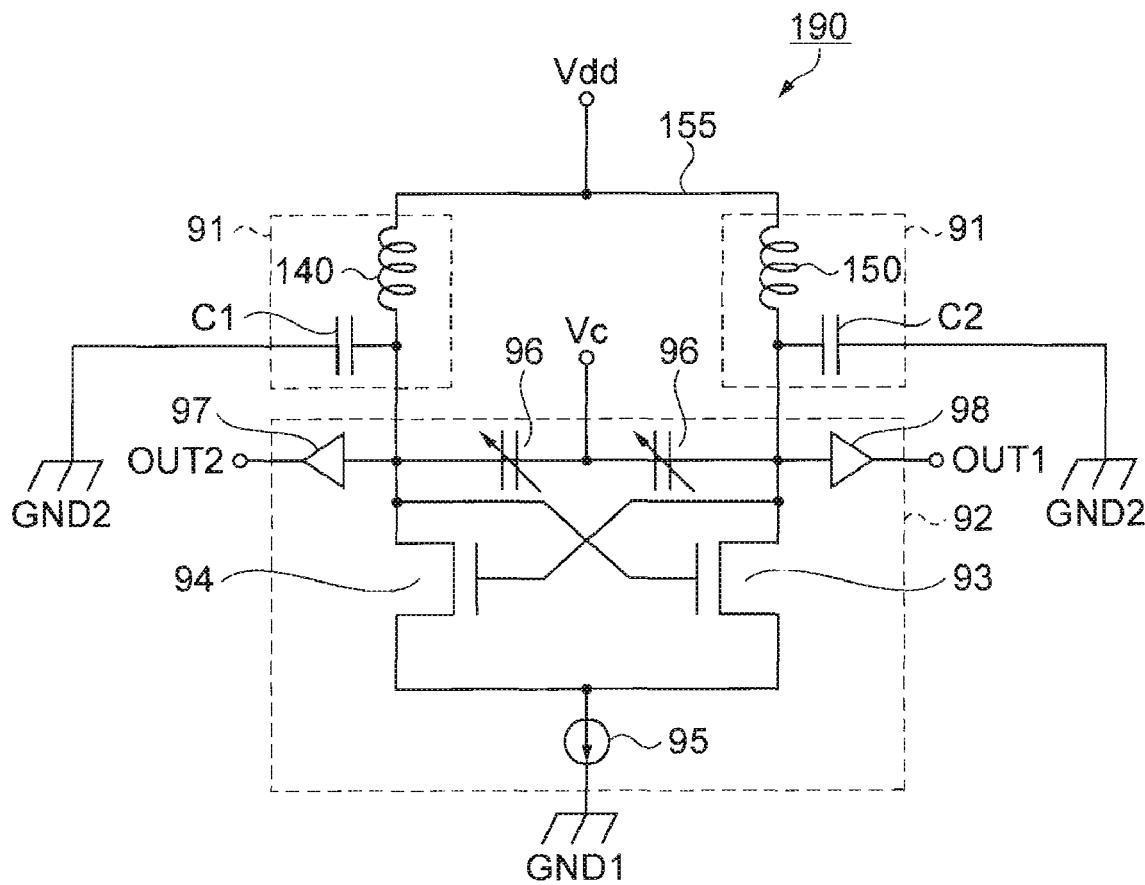
FIG. 6 is a circuit diagram illustrating a basic circuitry of a voltage controlled oscillator of the semiconductor device according to the second embodiment of the invention.

FIGS. 1 to 3 illustrate a semiconductor device in accordance with a first embodiment of the invention. FIGS. 4 to 6 illustrate a semiconductor device in accordance with a second embodiment of the invention.

The First Embodiment

FIG. 1 illustrates a plan view of the semiconductor device in accordance with the first embodiment. FIG. 2 illustrates a cross sectional view taken along a line A-A of FIG. 1. Here, FIG. 1 illustrates a state when the semiconductor device is seen through a second resin layer or a resist layer 75 and a covering film 76 shown in FIG. 2. FIGS. 1 and 2 exemplary illustrate a voltage controlled oscillator in accordance with the first embodiment of the invention.

In FIGS. 1 and 2, the semiconductor device 1 is composed essentially of an active element or an integrated circuit 12, Al wirings for establishing connections between circuit elements, not shown here, constituting the integrated circuit 12, a plurality of connection electrodes connected to the Al wirings to be exposed to a surface, the connection electrodes denoted by 14 and 15, respectively, in FIG. 2, passive elements or spiral inductors 40, 50 formed on a surface of a passivation film (SiN) 16 having openings for connection electrodes and covering the integrated circuit 12, and external terminals 81, 82, 83, 84, 85, 86 for connecting the integrated circuit 12 or the spiral inductor 40 with an external circuit.

The semiconductor device 1 is manufactured in such a manner that a plurality of semiconductor devices are arranged on a wafer, not shown, and then the plurality of semiconductor devices are scribed to be separated one by one to finally obtain a plurality of semiconductor chips. A structure explained herein is in the form of the semiconductor chip.

The integrated circuit 12 includes a group of circuit elements for controlling the semiconductor device 1 such as a transistor, not shown here, a variable capacitor, a constant circuit or the like. An entire surface of a semiconductor substrate 10 including the integrated circuit 12 is covered with the passivation film 16. The surface of the semiconductor substrate 10 includes openings for the connection electrodes, for example pads, in order to establish connections between the integrated circuit 12 and the above mentioned external terminals 81, 82, 83, 84, 85, 86, and the spiral inductors 40, 50. In FIG. 2, only the connection electrodes 14, 15 are illustrated and, hereinafter, those connection electrodes are referred to among the plurality of connection electrodes for the sake of the explanation.

The passivation film 16 are formed of SiN, SiO2, MgO or the like, and the connection electrodes 14, 15 are formed of Al.

An upper surface of the semiconductor substrate 10, namely a surface of the passivation film 16, is formed with connection wiring layers 25, 26. These connection wiring layers 25, 26 are so formed that alloyed metal layers of Ni, W, Cr, Ti, Pd, or the like are subjected to a spattering process. The layer 26 is formed to bond the wiring layer 55 with the passivaion layer 16. An upper surface of the connection wiring layer 26 is provided with a Cu connection wiring layer 55 formed thereon. It is preferable that the Cu connection wiring layer 55 is formed by means of a film formation means such as a Cu electrochemical plating so as to have a thickness of approximately 6 µm. A first resin layer 70, hereinafter simply referred to as the resin layer 70, is formed so as to cover a range of an upper surface of the passivation film 16 and an upper surface of the Cu connection wiring layer 55.

The resin layer 70 is preferably formed of a polyimide resin, but may be formed of a silicon modified polyimide resin, an epoxy resin, a silicon modified epoxy resin, a benzocyclobutene (BCB), a polybenzoxazine (POB) and the like as far as having a stress relaxation property.

It is preferable that the resin layer 70 has a thickness equal to or more than 20 µm.

The spiral inductors 40, 50 are formed into a turbinated shape on the surface of the first resin layer 70 as shown in FIG. 1. The spiral inductor 40 and the spiral inductor 50 have a symmetry shape with respect to a center line g, arranged between the spiral inductors. The spiral inductor 40 is exemplified hereinafter for the sake of explanation.

An end portion 41 at an outer end of the spiral inductor 40 is positioned in a range covered by the resin layer 70, connected to the connection electrode 14 through the connection wiring layer 25, has a raised up portion extending inwardly of the turbinated shape of the spiral inductor 40, and further extends on the surface of the resin layer 70. Accordingly, the turbinated shaped spiral inductor 40 is formed on the surface of the resin layer 70.

An end portion 42 of the spiral inductor 40 is connected to the raised up portion continuous from the Cu connection wiring layer 55.

On the other hand, one end portion of the Cu connection wiring layer 55 is branched to be connected to the end portions 42, 52 arranged inside of the spiral inductor 40 and the spiral inductor 50 in a corresponding manner. See FIG. 1. The other end portion of the Cu connection wiring layer 55 extends on the surface of the resin layer 70 to form a connection portion 61 to be connected to an external terminal 81. An end portion 51 positioned outside of the spiral inductor 50 is connected to the other connection electrode 14 formed on the semiconductor substrate 10.

The surface of the resin layer 70 is formed with a second resin layer or a resist layer 75 for covering the spiral inductors 40, 50. The resist layer 75 is a solder resist layer which seals entire surface of the first resin layer including the spiral inductors formed thereon, but merely has an area of an opening for the external terminal 81 to be formed thereat. With the resist layer 75, Cu wiring layer including the spiral inductors 40, 50 and the connection portion 61 is protected from a corrosion and prevented from an electrical degrade.

The semiconductor 1 is provided with a plurality of external terminals, for example, 6 external terminals 81, 82, 83, 84, 85, 86 are provided in the embodiment. See, FIG. 1. The external terminals 81, 82, 83, 84, 85, 86 are connected to the corresponding connection electrodes among the plurality of connection electrodes provided on the semiconductor substrate 10. The external terminal 81 is a Vdd terminal, the external terminal 82 is an output terminal OUT2, the external terminal 83 is a GND terminal, the external terminal 84 is a Vc terminal, the external terminal 85 is a GND terminal and the external terminal 86 is an output terminal OUT1. See, also FIG. 3.

Since the basic structures of the external terminals 81, 82, 83, 84, 85, 86 and the peripheries thereof are identical to each other, the external terminal 81 is exemplified for the sake of the explanation. The resist layer 75 is provided with the opening for forming the external terminal 81 thereat. The connection portion 61 which is exposed at the opening is a land 62, within which the external terminal 81 is formed.

The external terminal 81 is made of an electrically conductive metal which can establish an electrical connection by fusing thereof for example, a solder. Other than the solder, a soft solder or a hard solder can be utilized. According to the embodiment, the external terminal 81 is of a spherical shape and is a solder ball.

The surface of the resist layer 75 is formed with a covering film 76. The covering film 76 also covers basal portions of the external terminals 81, 82, 83, 84, 85, 86, namely, a lower portion of the external terminal 81 in FIG. 2. The covering film 76 includes a section formed on the surface of the resist layer 75 and a section being raised up herefrom to cover the basal portions of the external terminals 81, 82, 83, 84, 85, 86, in order to reinforce the external terminals 81, 82, 83, 84, 85, 86. After the semiconductor device 1 is mounted on the circuit board or the like, the covering film 76 enables to prevent a concentration of stress to the external terminals.

The semiconductor device 1 in accordance with the present embodiment, structured in the above described manner. The manufacturing method of such semiconductor device will be briefly explained hereinafter, referring to FIG. 2. The components illustrated in the drawings are exemplified for the sake of the explanation of the above described components.

Initially, the surface of the semiconductor substrate 10 formed with the passivation film 16 and the connection electrodes 14, 15 is further formed with the connection wiring layers 25, 26 composed of composed of alloyed metals, respectively, by means of the spattering process. Here, the connection electrodes 14, 15 and the connection wiring layers 25, 26 are in a state being electrically connected. The connection wiring layers 25, 26 are formed on the entire continuous surface at the time.

Nextly, the connection wiring layers 25, 26 are applied with Cu plating resist on their surfaces in order to provide a patterning of lower layers of the Cu wiring layers 41, 55 into predetermined shapes by means of an exposing process, thereby forming the lower layers of the Cu wiring layers 41, 55. The Cu plating resist is subsequently removed and unnecessary portions of connection wiring layers 25, 26 having the same plane shapes as the Cu wiring layers 41, 55 are also removed to form the connection wiring layers 25, 26 having the same plane shapes as the Cu wiring layers 41, 55.

Then, the first resin layer 70 composed of the polyimide resin is applied to the entire surface.

Here, the first resin layer 70 is once formed to have a thickness up to a height of the surfaces of the end portion 41 and the Cu connection wiring layer 55 of the spiral inductor 40, and thus formed resin layer is referred to as a first layer. Sequentially, the first resin layer 70 is provided with an opening portion having a shape excluding the end portion 41 and the raised up portion of Cu connection wiring layer 55 by means of the exposed process or the like. Thus opened portion and an entire surface of an uppermost layer of the first layer are formed with the the alloyed metal layer or the connection wiring layers 25, 26 by means of the spattering process. Applied on an upper surface of the resulting layer is the plating resist, followed by patterning and forming the portion without the end portion 41 and the raised up portion of the Cu connection wiring layer 55 of the Cu wiring layer by means of the Cu electrochemical plating on the surfaces of the connection wiring layers 25, 26, namely, the alloyed metal layer. Then, a second layer of the remaining thickness of the first resin layer 70 is applied to the entire surface including the upper surfaces of the Cu wiring layer and the Cu connection wiring layer 55. With the above stated process, a total thickness of the first resin layer 70 is defined.

The first resin layer 70 which is corresponding to the second layer is provided with openings for the raised up portion of the spiral inductor 40 and the raised up portion of the Cu connection wiring layer 55, followed by spattering again of the alloyed metal on the upper most layer of the first resin layer 70, applying the plating resist, patterning into the shape of the turbinated shape with the raised up portion of the spiral inductor 40, and the shapes of the raised up portion of the Cu connection wiring layer 55 and the connection portion 61, and thereby forming the spiral inductor 40 and the connection portion 61 via the Cu electrochemical plating. Then, unnecessary portions of the plating resist, the alloyed metal layer is removed.

Subsequently, the resist, namely, the soldering resist is applied to the surface of the first resin layer 70 including the surfaces of the spiral inductor 40 and the connection portion 61 to form the resist layer 75. The resist layer 75 is provided with an opening for a land 62. An external terminal 81 composed of a soldering ball is formed on the land 62 and then a covering film 76 serving as a base reinforcing layer is formed on the surface of the resist layer 75. It is desirable that the covering film 76 is formed of the polyimide resin.

Subsequently, a circuitry of the semiconductor device 1 having the above stated structure and manufactured by the above stated method will be explained, referring to FIG. 3. The semiconductor device 1 as explained in the embodiment is featured in that the spiral inductors 40, 50 are formed of the Cu wiring layers and thus is applicable to various circuits. Specifically, such semiconductor device is suitable to be used in the voltage controlled oscillator having the spiral inductors 40, 50, and therefore, the voltage controlled oscillator will be employed as an typical example for the sake of the explanation.

FIG. 3 illustrates a circuit diagram showing a basic circuitry of the voltage controlled oscillator 90 employing the semiconductor device 1 in accordance with the first embodiment. In FIG. 3, the voltage controlled oscillator 90 as described above includes a monolithic circuit area 92 in the integrated circuit 12 and a pair of Cu wiring layer areas 91, namely passive element areas, formed with the spiral inductors 40, 50 provided on the upper surface of the integrated circuit 12 in a multi-layered manner.

The voltage controlled oscillator 90 is connected to a power supply potential terminal Vdd, which will hereinafter be referred to as a "Vdd terminal", a variable capacitance terminal Vc which will hereinafter be referred to as a "VC terminal", and a ground potential terminal GND which will hereinafter be referred simply to as a "GND terminal". In the voltage controlled oscillator 90, the spiral inductors 40, 50, two variable capacitors 96, N channel transistors 93, 94 serving as a negative resistance section and a current regulator 95 are arranged in this order from the Vdd terminal toward the GND terminal.

One ends of the spiral inductors 40, 50 are connected to the Vdd terminal and the other ends thereof are connected to one ends of the variable capacitors 96, respectively.

In the negative resistance section, a drain of the N channel transistor 93 is connected to an output terminal OUT1 and a gate is connected to an output terminal OUT2. A drain of the N channel transistor 94 is connected to the output terminal OUT2 and a gate is connected to the output terminal OUT1. Arranged immediately before the output terminals OUT1 and OUT2 are buffer amplifiers 97, 98 for amplifying output signals.

In the voltage controlled oscillator 90 having the above stated circuitry, upon being connected to the Vdd terminal and the GND terminal, a LC resonance circuit outputs complementing resonance signals from the output terminal OUT1 and the output terminal OUT2 when a voltage is applied to the LC resonance circuit composed of the spiral inductors 40, 50 and two variable capacitors 96. However, in this state, the oscillation will be attenuated.

Therefore, a positive variable potential is applied to the Vc terminal and a ground potential is applied to the GND terminal, resptectively, in order to supply current as well as the negative resistance section is provided to force the LC resonance circuit to output the resonance signals permanently.

Therefore, according to the above stated first embodiment, the surface of the first resin layer 70 formed on the semiconductor substrate 10 is provided with the passive elements or the spiral inductors 40, 50 composed of the Cu wiring layer. The Cu wiring layer has a specific resistance smaller by approximately 30% than that of the Al wiring layer having been utilized. Also, the Cu wiring layer can be formed into a thick layer since it is processed by the Cu electrochemical plating, thereby being capable of keeping a wiring resistance of the Cu wiring layer low.

In a case that the semiconductor substrate 10 is the semiconductor chip separated from the wafer by means of scribing, since the spiral inductors 40, 50 are constituted of the Cu wiring layers on the surface of the first resin layer 70 on the semiconductor substrate 10, a large section of the plane shape, namely the plane shaped area, of the semiconductor chip can be available for an formation of the spiral inductors, widths of the Cu wiring layers forming the spiral inductors 40, 50 can be enlarged as well as a wiring resistance can be minimized.

As well known in the art, a Q value is in proportion to a reactance and is inverse proportion to a resistance value. Therefore, the Q value can be raised by lowering the wiring resistance of the spiral inductors 40, 50.

It is known that a phase noise characteristic of the resonance circuit of the voltage controlled oscillator 90 in accordance with the embodiment is inverse proportion to the square of the Q value. The Q value used in the phase noise characteristic of the oscillating circuit, however, is a value which represents a loss of the entire circuit, namely a load Q, but it is allowable to consider that the Q value equals to the Q value of the spiral inductors since the spiral inductors make a largest contribution according to the embodiment. That is to say, the larger the Q value of the spiral inductors, the lower the phase noise characteristic, i.e. phase noise.

According to the semiconductor device 1 having the above stated structure, the spiral inductors 40, 50, excluding portions of the external terminals 81, 82, 83, 84, 85, 86, are sealed with the resist layer 75, and thus the semiconductor can have a sealing property equivalent to a packaging without actually providing the packaging, can prevent the interior wiring layers from erosion or the like, and further can provide a small semiconductor device of a size of the semiconductor chip with resin sealed.

The surface of the resist layer 75 is formed with a covering film 76, and thus better sealing property is obtainable. Also, the bases of the external terminals 81, 82, 83, 84, 85, 86 can be reinforced with the covering film 76 which allows the external terminals 81, 82, 83, 84, 85, 86 for better fixing strength or connection strength, and a connection stress upon mounting the device onto the circuit substrate can be dispersed as well.

The Second Embodiment

Explained next is a semiconductor device in accordance with a second embodiment of the invention, referring to the attached drawings. The second embodiment 2 is, if compared with the above described first embodiment, featured in using the Cu wiring layers and having capacitors besides the passive elements or the spiral inductors. Since a forming structure and a forming method of each of the Cu wiring layers are identical to or within a range of applications of those in accordance with the first embodiment as seen in FIGS. 1 and 2, detailed explanations thereof are omitted here but the same or similar numbers are attached to the components having the same or similar structures.

FIGS. 4 and 5 illustrate a semiconductor device 100 in accordance with the second embodiment. FIG. 4 is a plane view of the semiconductor device 100 of the second embodiment. FIG. 5 is a cross sectional view of the semiconductor device 100 taken along a line B-B in FIG. 4. In FIGS. 4 and 5, an uppermost layer of the semiconductor substrate 10 is formed with the passivation film 16 and the connection electrode 17. Connection wiring layers 125, 126 are formed on the passivation film 16 and the connection electrode 17, and further upon thereof the lower layer of Cu wiring layers 141, 156 are formed.

The surface of the connection wiring layer 126 is formed with lower electrode section 156 of the capacitors C1, C2 continuous to a Cu connection wiring layer 155 provided in a Cu plating manner. The Cu connection wiring layer 155, as shown in FIG. 4, is branched in the halfway of an extension of the lower electrode section 156, and one end portion thereof is connected to an end portion 142 of the spiral inductor 140. Then, the other end portion of the Cu connection wiring layer 155 is connected to an end portion 152 of the spiral inductor 150.

The other end portions 141, 151 of the respective spiral inductors 140, 150 are connected to the GND terminal in such a manner identical to the structure for connecting the end portion 41 of the spiral inductor 40 with the connection electrode 14 in accordance with the above stated first embodiment. See FIGS. 2 and 6.

The upper surface of the passivation film 16 is formed with the first resin layer 70 or the uppermost layer on which the spiral inductors 140, 150 composed of the first Cu wiring layers and the upper electrode section 165 constituting capacitors C1, C2 composed of the second Cu wiring layers.

The spiral inductors 140, 150 have the same plane structures as those of the first embodiment as seen in FIG. 1. The upper electrode section 165 constituting the capacitors C1, C2 is formed so as to extend the Cu wiring layer 164. The capacitors C1, C2 are of the same size to each other in accordance with the embodiment.

Explained hereinafter are structures of the capacitors C1, C2. As the capacitors C1, C2 have the same structures, the capacitor C1 is exemplified here. A portion of the lower layer of the Cu connection wiring layer 155 and a portion of the upper layer of the Cu wiring layer 164 are formed so as to intersect each other in a plane direction. At the intersection, the upper layer corresponds to the upper electrode section 165 of the capacitor, and the lower layer corresponds to the lower electrode section 156, and an area of the first resin layer 70 sandwiched between the upper electrode section 165 and the lower electrode section 156 corresponds to a dielectric of the capacitor. The capacitors C1, C2 are formed in the above stated manner.

The above stated spiral inductors 140, 150 and a surface of the upper electrode section 165 are covered with the resist layer or the second resin layer 75. Then, the external terminal 83 and the covering film 76 are formed thereon. The external terminals 81, 82, 83, 84, 85, 86 are formed in a manner similar to the illustrated external terminal 83 and the external terminal 81 in accordance with the above stated first embodiment. See FIG. 2.

A circuitry of the semiconductor device 100 having the structure in accordance with the above stated embodiment 2 will be explained hereinafter, referring to FIG. 6. The semiconductor device 100 as explained in the embodiment is featured in using the Cu wiring layer for the sake of forming the spiral inductors 140, 150 and the capacitors C1, C2. The voltage controlled oscillator is exemplified for explanation as having been done in the first embodiment. See FIG. 3.

FIG. 6 illustrates a circuit diagram showing a basic circuitry of the voltage controlled oscillator 190 of the semiconductor 100 in accordance with the second embodiment. FIG. 4 will also be referred to herein. In FIGS. 4 and 6, the voltage controlled oscillator 190 includes the monolithic circuit area 92, namely, the active element area, in the integrated circuit 12 and the Cu wiring layer area 91, namely, the passive element area, on which the spiral inductors 140, 150 and the capacitors C1, C2 formed on the upper surface of the integrated circuit 12 in the multi-layered manner.

The voltage controlled oscillator 190 is connected to the power supply potential terminal Vdd, which is hereinafter referred to as the Vdd terminal, the variable capacitance terminal Vc, which is hereinafter referred to as the Vc terminal, and the ground potential terminal GND1, which is hereinafter simply referred to as GND1 terminal. The voltage controlled oscillator 190 includes between the Vdd terminal and the GND1 terminal the spiral inductors 140, 150, the capacitors C1, C2, and two variable capacitors 96, the negative resistance sections or the N channel transistors 93, 94 and the current regulator 95 in this order.

One ends of the spiral inductors 140, 150 are connected to the Vdd terminal, and the other ends of the spiral inductors 140, 150 are connected to the end portions of capacitors C1, C2, respectively. The one ends of the capacitors C1, C2 are connected to the corresponding GND terminals GND2, and the other end portions thereof are connected to the corresponding variable capacitors 96, Therefore, the capacitors C1, C2 and the variable capacitors 96 are electrically connected in parallel.

In the negative resistance section, the drain of the N channel transistor 93 is connected to the output terminal OUT1 and the gate is connected to the output terminal OUT2. Also, the drain of the N channel transistor 94 is connected to the output terminal OUT2 and the gate is connected to the output terminal OUT1.

The voltage controlled oscillator 190 basically has the same function as that of the above described embodiment 1, except for the additional capacitors C1, C2; however, an additional capacity is added to the LC resonance circuit.

Consequently, according to the above described second embodiment, the increased capacitance is obtainable by providing the capacitors C1, C2 outside the integrated circuit 12 in parallel with the variable capacitor 96. It is known that an oscillatory frequency becomes small when the capacitance becomes large. In view of the foregoing, a low frequency area oscillator can be realized.

The variable capacitor 96 provided in the integrated circuit 12 is restricted by a size, a dielectric constant and is limited by the capacitance. However, providing the capacitors C1, C2 in accordance with the embodiment will enable an enlargement of a selectable width of the frequency as well as will enable the enlarged areas of the upper electrode sections 165 and the lower electrodes section 156 on the semiconductor substrate 10, thereby enabling an increased capacitance of the capacitors C1, C2.

In addition to the variable capacitor 96, the additional capacitors C1, C2 will be able to enlarge a setting range of the capacitance of the capacitors, such that the frequency band of the voltage controlled oscillator 190 can be expanded.

With the above described structure, the sealing property equivalent to the effect obtainable from the packaging without a further packaging as stated in the first embodiment, thereby being able to prevent the interior wiring layers from the corrosion and to provide a resin sealed small semiconductor device of the semiconductor chip size.

The spiral inductors 140, 150 and the upper electrode sections 165 of the capacitors C1, C2 are formed on the same surface of the first resin layer 70, such that they can be formed in the same process at the time of forming the upper layer of the Cu wiring layer, and therefore two passive elements can be manufactured without increasing the manufacturing steps.

It should be appreciated that the invention is not limited to the above stated embodiments, but includes the modifications and improvements as far as such modifications and improvements are within a scope capable of achieving the advantage of the invention.

In other words, the invention is illustrated and explained especially relating to specific embodiments; however, it should be appreciated that, without departing from the technical idea and the scope of advantage of the invention, a person skilled in the art can make various modifications for the above stated embodiments with respect to shapes, materials, combinations thereof, and the other detailed structures.

The above descriptions as to the shapes, materials, orders of manufacturing steps and the like are mere examples for the purpose of facilitating an interpretation of the invention, and, therefore, do not limit the invention, such that descriptions with the component names without limitations of a portion or all of the shapes, materials and combinations thereof and orders of manufacturing steps and the like should be considered as being encompassed in the scope of the invention For example, the above described embodiment 2 includes the spiral inductors 140, 150 and the capacitors C1, C2 arranged on the surface of the first resin layer 70. Such structure can be modified to include only capacitors C1, C2 to be arranged on the surface of the first resin layer 70.

According to the above stated first and second embodiments, the spiral inductors 40, 50 and 140, 150 are utilized as the inductors of the LC resonators for the purpose of exemplary explanation; however, also can be utilized as plane antennas of the turbinated shape in order to be applied as the semiconductor device for communication.

Besides the above described spiral inductors and capacitors, it is possible to form other passive elements composed of the Cu wiring layers and to combine the circuit elements to be connected thereto.

In view of the above stated first and second embodiments, it is possible to provide the oscillator having the passive elements of high Q values and having excellent phase noise property and being capable of expanding the selectable width of the frequency, and the semiconductor device having such oscillator and thereby being capable of constituting the package of the size of the semiconductor chip. The entire disclosure of Japanese Patent Application Nos: 2005-216883, filed Jul. 27, 2005 and 2006-176274, filed Jun. 27, 2006 are expressly incorporated by references herein.

What is claimed is:

1. A semiconductor device comprising:
a semiconductor substrate including an active element or an integrated circuit and a plurality of connection electrodes to be electrically connected to the integrated circuit;
a first resin layer formed on a surface of the semiconductor substrate on which the connection electrodes are formed;
a connection wiring layer formed between the semiconductor substrate and the first resin layer and connected to one of the plurality of connection electrodes;
a Cu wiring layer connected at one end thereof to the connection wiring layer and formed on the surface of the first resin layer;
a passive element composed of the first resin layer, the connection wiring layer and the Cu wiring layer, the first resin layer interposing the connection wiring layer and the Cu wiring layer;
a second resin layer for covering a surface of the Cu wiring layer; and
an external terminal electrically connected to some of the plurality of connection electrodes and formed such that a portion of the second resin layer protrudes from the second resin layer; wherein
the first resin layer having a thickness up to a height of the surface of the Cu wiring layer and the connection wiring layer; wherein an end portion and the connection wiring layer of the passive element extends from a point beneath to a point above the first resin layer.

2. The semiconductor device according to claim 1, wherein the passive element is a spiral inductor composed of the Cu wiring layer formed on the surface of the first resin layer.

3. The semiconductor device according to claim 1, wherein the passive element is a capacitor including the connection wiring layer, the Cu wiring layer, and the first resin layer sandwiched between areas where the connection wiring layer and the Cu wiring layer intersect each other, and wherein the capacitor is connected in parallel with the variable capacitor provided on the integrated circuit.

4. The semiconductor device according to claim 1, wherein the passive element is constituted of a spiral inductor composed of the first Cu wiring layer formed on the surface of the first resin layer and a capacitor composed of a second Cu wiring layer formed on the surface of the first resin layer, the connection wiring layer and the first resin layer sandwiched between areas where the second Cu wiring layer and the connection wiring layer intersect each other.

5. The semiconductor device according to claim 1, wherein the semiconductor device is sealed with the second resin layer, except for a portion of the external terminal.

6. An oscillator comprising:
- a semiconductor substrate including an active element or an integrated circuit and a plurality of connection electrodes electrically connected to the integrated circuit;
- a first resin layer formed on a surface of the semiconductor device on which the connection electrodes are formed in such a manner avoiding the connection electrodes;
- a connection wiring layer formed between the semiconductor substrate and the first resin layer;
- a spiral inductor that includes: (i) a first Cu wiring layer of which one end is connected to the connection wiring layer connect to one of the plurality of connection electrodes and which is formed on the surface of the first resin layer, and (ii) the connection wiring layer;
- a capacitor that includes: (i) a second Cu wiring layer formed on the surface of the first resin layer, (ii) the connection wiring layer connected to the spiral inductor, and (iii) the first resin layer sandwiched between areas in which the second Cu wiring layer and the connection wiring layer are intersected;
- a second resin layer covering the surface of the first and second Cu wiring layers; and
- an external end that is electrically connected to several of the plurality of connection electrodes and of which part is protruded from the second resin layer.

7. The semiconductor device according to claim 2, a thickness at a first resin layer being about or greater than 20 μm.

8. An oscillator comprising:
- a semiconductor substrate including an active element or an integrated circuit and a plurality of connection electrodes electrically connected to the integrated circuit;
- a first resin layer formed on a surface of the semiconductor device on which the connection electrodes are formed in such a manner avoiding the connection electrodes;
- a connection wiring layer formed between the semiconductor substrate and the first resin layer;
- a spiral inductor that includes: (i) a first Cu wiring layer of which one end is connected to the connection wiring layer connected to one of the plurality of connection electrodes and which is formed on the surface of the first resin layer, and (ii) the connection wiring layer;
- a capacitor that includes: (i) a second Cu wiring layer formed on the surface of the first resin layer, (ii) the connection wiring layer connected to the spiral inductor, and (iii) the first resin layer sandwiched between areas in which the second Cu wiring layer and the connection wiring layer are intersected; and
- an external end that is electrically connected to several of the plurality of connection electrodes,
- an oscillating circuit including the spiral inductor and the capacitor connected in parallel.

9. The semiconductor device as set forth in claim 6, the semiconductor device being sealed, except part of the external end, by the second resin layer.

* * * * *